(12) United States Patent
Sugiyama et al.

(10) Patent No.: US 11,329,473 B2
(45) Date of Patent: May 10, 2022

(54) DRIVER CIRCUIT HAVING OVERCURRENT PROTECTION FUNCTION AND CONTROL METHOD OF DRIVER CIRCUIT HAVING OVERCURRENT PROTECTION FUNCTION

(71) Applicants: TOSHIBA ELECTRONIC DEVICES & STORAGE CORPORATION, Tokyo (JP); AISIN AW CO., LTD., Anjo (JP)

(72) Inventors: Hiroyuki Sugiyama, Anjo (JP); Yuji Yamanaka, Kanagawa (JP); Tatsufumi Kurokawa, Kanagawa (JP)

(73) Assignees: TOSHIBA ELECTRONIC DEVICES & STORAGE CORPORATION, Tokyo (JP); AISIN AW CO., LTD., Aichi-Ken (JP)

( * ) Notice: Subject to any disclaimer, the term of this patent is extended or adjusted under 35 U.S.C. 154(b) by 2 days.

(21) Appl. No.: 16/932,776

(22) Filed: Jul. 19, 2020

(65) Prior Publication Data

US 2021/0028614 A1 Jan. 28, 2021

(30) Foreign Application Priority Data

Jul. 26, 2019 (JP) .............................. JP2019-137934

(51) Int. Cl.
| | |
|---|---|
| *H02H 3/00* | (2006.01) |
| *H02H 3/08* | (2006.01) |
| *H03K 21/02* | (2006.01) |
| *H03K 3/86* | (2006.01) |
| *H02H 1/00* | (2006.01) |

(52) U.S. Cl.
CPC ............ *H02H 3/08* (2013.01); *H02H 1/0007* (2013.01); *H03K 3/86* (2013.01); *H03K 21/02* (2013.01)

(58) Field of Classification Search
CPC .......... H02H 3/08; H02H 1/0007; H03K 3/86; H03K 21/02
USPC .......................................................... 361/87
See application file for complete search history.

(56) References Cited

U.S. PATENT DOCUMENTS

| 10,763,738 B1* | 9/2020 | Dharmalinggam ... H02M 3/158 |
| 2010/0134939 A1* | 6/2010 | Takahashi ............ H03K 17/284 361/87 |
| 2014/0016240 A1* | 1/2014 | Kawata ................ G09G 3/3674 361/95 |

(Continued)

FOREIGN PATENT DOCUMENTS

| JP | 2000298522 A | 10/2000 |
| JP | 2006025547 A | 1/2006 |

(Continued)

*Primary Examiner* — Jared Fureman
*Assistant Examiner* — Lucy M Thomas
(74) *Attorney, Agent, or Firm* — Holtz, Holtz & Volek PC

(57) ABSTRACT

According to one aspect of embodiments, a driver circuit having an overcurrent protection function includes a control signal generating circuit that outputs a Pulse Width Modulation (PWM) control signal for controlling turning ON and OFF of the output transistor that supplies output current to a load; and a control circuit that generates a signal indicating an overcurrent state when a count value of an overcurrent detecting signal exceeds a predetermined number, which indicates that a value of an output current of the output transistor within the predetermined time interval exceeds a predetermined threshold value.

17 Claims, 7 Drawing Sheets

(56) References Cited

U.S. PATENT DOCUMENTS

2016/0308524 A1* 10/2016 Inoue ................... H03K 17/168
2018/0337599 A1* 11/2018 Chen ..................... H02M 3/158
2019/0238123 A1    8/2019 Yamanaka

FOREIGN PATENT DOCUMENTS

| JP | 2012164268 A | 8/2012 |
| JP | 2016218639 A | 12/2016 |
| JP | 2019134233 A | 8/2019 |

* cited by examiner

DRIVER CIRCUIT HAVING OVERCURRENT PROTECTION FUNCTION AND CONTROL METHOD OF DRIVER CIRCUIT HAVING OVERCURRENT PROTECTION FUNCTION

CROSS-REFERENCE TO RELATED APPLICATIONS

This application is based upon and claims the benefit of priority from Japanese Patent Application No. 2019-137934, filed on Jul. 26, 2019; the entire contents of which are incorporated herein by reference.

FIELD

An embodiment described herein relates generally to a driver circuit having an overcurrent protection function and a control method of the driver circuit having the overcurrent protection function.

BACKGROUND

Conventionally, there has been disclosed various technologies for protecting an output transistor of a driver circuit from overcurrent. A state of overcurrent occurs due to not only continuation of an overcurrent state such as a power-supply fault and a ground fault, but also a noise, etc.

Conventionally, in order to prevent a malfunction due to overcurrent, there has been considered a configuration having a mask time interval in which no response is made, after an overcurrent detection signal indicating an overcurrent state is detected, to the overcurrent detection signal for a predetermined time period. However, when overcurrent due to a ground fault and the like flows during the mask time interval, the overcurrent continues to flow into an output transistor, and thus there presents possibility that the output transistor goes into a failure. Moreover, a driver circuit is driven by a Pulse Width Modulation (PWM) control signal whose duty ratio is adjusted in accordance with an output voltage, for example. Thus, there has been desired a configuration that is capable of reliably detecting an overcurrent state even when a duty ratio of the PWM control signal is small.

DETAILED DESCRIPTION

According to one aspect of embodiments, a driver circuit having an overcurrent protection function includes an output transistor, a control signal generating circuit, a current detecting circuit, an overcurrent detecting circuit, a counter, and a control circuit. The output transistor supplies output current to a load. The control signal generating circuit outputs a Pulse Width Modulation (PWM) control signal. The PWM control signal controls turning ON and OFF of the output transistor. The current detecting circuit detects a current flowing through the output transistor. The overcurrent detecting circuit outputs an overcurrent detecting signal when a value of the current detected by the current detecting circuit exceeds a predetermined threshold value. The counter counts a number of outputs from the overcurrent detecting signal. The control circuit generates, when a count value of the counter exceeds a predetermined number within a predetermined time interval, a signal indicating an overcurrent state.

Exemplary embodiments of a driver circuit having an overcurrent protection function and a control method thereof will be explained below in detail with reference to the accompanying drawings. The present invention is not limited to the following embodiments.

First Embodiment

Figure 1:
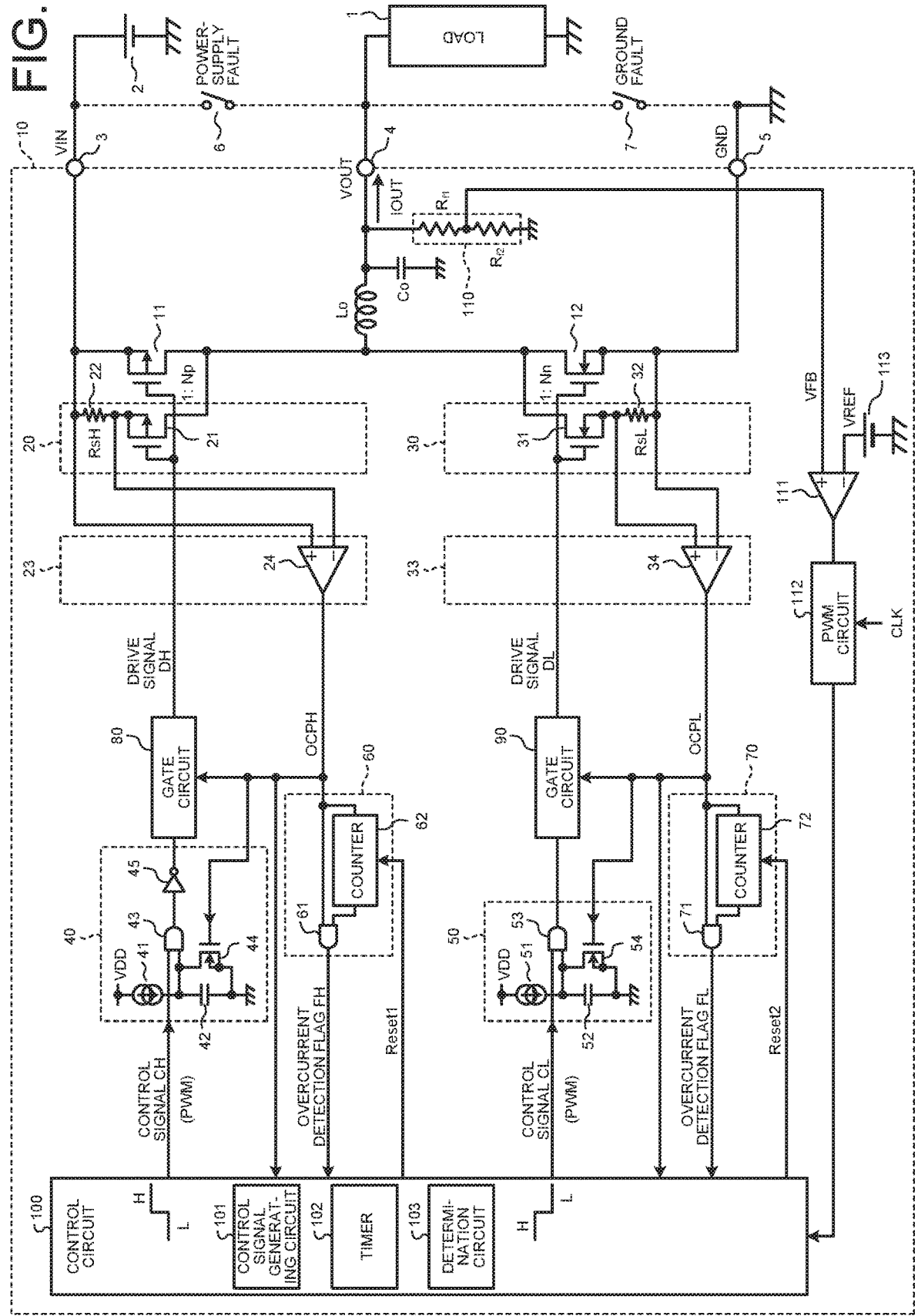
FIG. 1 is a diagram illustrating a driver circuit having an overcurrent protection function according to a first embodiment.

FIG. 1 is a diagram illustrating a driver circuit having an overcurrent protection function according to a first embodiment. A driver circuit 10 according to the present embodiment constitutes a DC/DC power-source circuit that converts a direct-current input voltage VIN into a direct-current output voltage VOUT, and outputs the converted voltage. The driver circuit 10 is configured to generate PWM-modulation control signals CH and CL whose duty ratios are adjusted in accordance with a comparison result between a feedback voltage VFB of the output voltage VOUT with a reference voltage VREF.

The driver, circuit 10 includes a PMOS output transistor 11 that supplies an output current IOUT to a load 1. A source of the PMOS output transistor 11 is connected to a power-source supplying terminal 3, and a drain of the PMOS output transistor 11 is connected to an output terminal 4. In other words, a source-drain path, which is a main current path of the DUOS output transistor 11, is connected between the power-source supplying terminal 3 and the output terminal 4. The PMOS output transistor 11 is arranged on the power-source supplying terminal 3 side, and thus may be referred to as a high-side output transistor. A power source 2 is connected to the power-source supplying terminal 3, which supplies the direct-current input voltage VIN.

One end of an inductor Lo is connected to a drain of the PMOS output transistor 11, and the other end of the inductor Lo is connected to the output terminal 4. One end of a smoothing capacitor Co is connected to the output terminal 4, and the other end of the smoothing capacitor Co is grounded. The output terminal 4 is connected to the load 1. The load 1 includes, for example, a motor, a solenoid, and the like. Electric current is supplied to them so as to execute electric power conversion.

In the present embodiment, there is provided a current detecting circuit 20 that detects current flowing into the PMOS output transistor 11. The current detecting circuit 20 includes a PMOS transistor 21 and a resistance 22. A drain of the PMOS transistor 21 is connected to the drain of the PMOS output transistor 11, and a source of the PMOS transistor 21 is connected to the power-source supplying terminal 3 via the resistance 22.

Drains and gates of the PMOS output transistor 11 and the PMOS transistor 21 are commonly connected so as to constitute a current mirror circuit. When a dimensional ratio between the PMOS transistor 21 and the PMOS output transistor 11 is set to "1:Np (Np is arbitrary positive number)", drain current that is 1/Np drain current of the PMOS output transistor 11 flows into the PMOS transistor 21. Thus, when drain current of the PMOS transistor 21 is detected, current flowing into the PMOS output transistor 11 is able to be detected.

For example, when a value of Np is 1000, current that is substantially the same as the output current LOUT flows into the PMOS output transistor 11. Thus, when drain current of the PMOS transistor 21 is detected, the output current IOUT is able to be monitored.

When current flowing into the PMOS transistor 21 is set to 1/Np drain current flowing into the PMOS output transistor 11, electric-power consumption of the current detecting circuit 20 able to be reduced.

In the present embodiment, there is provided an overcurrent detecting circuit 23. The overcurrent detecting circuit 23 includes a comparison circuit 24 whose input ends are connected to both ends of the resistance 22. A non-inversion input end (+) of the comparison circuit 24 is connected to the power-source supplying terminal 3 side of the resistance 22, and an inversion input end (−) of the comparison circuit 24 is connected to the PMOS transistor 21 side of the resistance 22. When a voltage drop in the resistance 22 exceeds a threshold value of the comparison circuit 24, the comparison circuit 24 outputs an H-level overcurrent detection signal OCPH.

The overcurrent detection signal OCPH is supplied to a gate circuit 80. When the H-level overcurrent detection signal OCPH is supplied, the gate circuit 80 supplies an H-level drive signal PH to a gate of the PMOS output transistor 11. In other words, control for turning OFF the PMOS output transistor 11 is executed. Caused by this control, when the overcurrent detecting circuit 23 detects the output current IOUT that exceeds a predetermined threshold value, the PMOS output transistor 11 is immediately turned OFF without providing a mask time interval. Thus, it is possible to prevent a case where the PMOS output transistor 11, the load 1, or the like goes into a failure.

The overcurrent detection signal OCPH is supplied to an interval setting circuit 40. The interval setting circuit 40 includes an NMOS transistor 44 having a gate to which the overcurrent detection signal OCPH is supplied. A capacitor 42 is connected between a source and a drain of the NMOS transistor 44. The interval setting circuit 40 includes an AND circuit 43 and a constant-current source 41 that charges the capacitor 42.

One input end of the AND circuit 43 is connected to a connection point between the capacitor 42 and the constant-current source 41, and a PWM control signal CH transmitted from a control circuit 100 is supplied to the other input end of the AND circuit 43. An output signal of the AND circuit 43 is supplied to an inverter circuit 45, and an output signal of the inverter circuit 45 is supplied to the gate circuit 80.

When voltages of both of the PWM control signal CH and the capacitor 42 are H-level, the AND circuit 43 outputs an H-level signal. An H-level output signal of the AND circuit 43 is inverted into an L-level signal by the inverter circuit 45, and is output via the gate circuit 80. In other words, when an output signal of the inverter circuit 45 is L-level, the drive signal DH output from the gate circuit 80 becomes L-level, and the PMOS output transistor 11 is turned ON.

On the other hand, when the overcurrent detecting circuit 23 detects overcurrent and the overcurrent detection signal OCPH becomes H-level, the NMOS transistor 44 is turned. ON so as to discharge electric charge of the capacitor 42. Thus, a voltage of the capacitor 42 becomes L-level, an output signal of the AND circuit 43 becomes L level, and the inverter circuit 45 outputs an H-level signal. When the H-level signal is suppled from the inverter circuit 45, the gate circuit 80 supplies the H-level drive signal DH to a gate of the PMOS output transistor 11. Thus, the PMOS output transistor 11 is turned OFF. In other words, when the H-level overcurrent detection signal OCPH is supplied from the comparison circuit 24 or an H-level signal is supplied from the inverter circuit 45, the gate circuit 80 supplies the H-level drive signal DH to the gate of the PMOS output transistor 11.

The capacitor 42 is charged by the constant-current source 41, and thus the voltage on an electrode side that is connected to the AND circuit 43 linearly rises in proportion to the time. When the voltage of the capacitor 42 rises to reach an H-level, the AND circuit 43 outputs an H-level signal. In this case, an L-level signal is supplied to the gate circuit 80 from the inverter circuit 45, and the L-level drive signal DH is supplied to the gate of the PMOS output transistor 11. Thus, the PMOS output transistor 11 is turned ON.

In other words, when the overcurrent detecting circuit 23 detects an overcurrent state and the H-level overcurrent detection signal OCPH is output, control is executed for turning ON the PMOS output transistor 11 at predetermined time intervals decided by using a current value of the constant-current source 41, a capacitance value of the capacitor 42, and a threshold value of the AND circuit 43.

When the H-level overcurrent detection signal OCPH is not output from the overcurrent detecting circuit 23, in other words, in a case of a non-overcurrent state, the voltage of the capacitor 42 is kept to be H-level. Thus, it goes into a state of control in which the PMOS output transistor 11 is turned ON when the PWM control signal CH is H-level and the PMOS output transistor 11 is turned OFF when the PWM control signal CH is h-level, in other words, a steady control state in which the PMOS output transistor 11 is turned ON/OFF in accordance of a level of the PWM control signal CH.

The overcurrent detection signal OCPH is supplied to a count circuit 60. The count circuit 60 includes a counter 62 that counts the number of the H-level overcurrent detection signals OCPH. When a count value of the overcurrent detection signal OCPH reaches a predetermined number, for example, "4", the counter 62 outputs an H-level signal, and an AND circuit 61 outputs an H-level overcurrent detection flag FH. Thus, the H-level overcurrent detection flag FH indicates that a state continues where overcurrent is flowing into the PMOS output transistor 11.

The state where overcurrent is flowing into the PMOS out transistor 11 occurs in a state where the output terminal 4 is in a grounded state, for example, in other words, in a case of a ground fault. In this case, when the input voltage VIN is directly applied to between a source and a drain of the PMOS output transistor 11, it is turned into a state where overcurrent flows. In FIG. 1, a switch 7 is illustrated in order to illustrate a state of a ground fault. A state where the switch 7 is turned ON corresponds to a ground fault.

In the present embodiment, there is provided an NMOS output transistor 12 whose source-drain path, which is a main current path, is connected between the output terminal 4 and a grounding terminal 5. When the PMOS output transistor 11 is turned. ON and the NMOS output transistor 12 is turned OFF, energy is accumulated in the load 1 by drain current of the PMOS output transistor 11. When the PMOS output transistor 11 is turned OFF, the NMOS output transistor 12 is turned ON, and the energy accumulated in the load 1 is released. In other words, the NMOS output transistor 12 is an output transistor that is turned ON/OFF alternately with the PMOS output transistor 11. The NMOS output transistor 12 is arranged on the grounding terminal 5 side, and thus may be referred to as a low-side output transistor.

In the present embodiment, there is configured to protect against a state where overcurrent flows into the NMOS output transistor 12. For example, in a state where the output terminal 4 is in contact with the power-source supplying terminal 3, in other words, in a case of a power-supply fault, it goes into a state where overcurrent flows into the 511405 output transistor 12. In the present embodiment, there is provided a current detecting circuit 30 that detects current flowing into the NMOS output transistor 12. The current detecting circuit 30 includes an NMOS transistor 31 and a resistance 32. A drain of the NMOS transistor 31 is connected to a drain of the NMOS output transistor 12, and a source of the HMOS transistor 31 is connected to the grounding terminal 5 via the resistance 32.

Drains and gates of the NMOS output transistor 12 and the NMOS transistor 31 are commonly connected to constitute a current mirror circuit. When a dimensional ratio between the NMOS transistor 31 and the NMOS output transistor 12 is set to "1:Nn (Nn is arbitrary positive number)", drain current that is 1/Nn drain current of the NMOS output transistor 12 flows into the NMOS transistor 31. Thus, when drain current of the NMOS transistor 31 is detected, current flowing into the NMOS output transistor 12 is able to be detected.

For example, when a value of Nn is 1000, current that is substantially the same as the output current IOUT flows into the NMOS output transistor 12. Thus, when drain current of the NMOS transistor 31 is detected, the output current IOUT is able to be monitored.

When current flowing into the HMO transistor 31 is set to 1/Nn drain current flowing into the NMOS output transistor 12, electric-power consumption of the current detecting circuit 30 is able to be reduced.

In the present embodiment, there is provided an overcurrent detecting circuit 33. The overcurrent detecting circuit 33 includes a comparison circuit 34 whose input ends are connected to both ends of the resistance 32. A non-inversion input end (+) of the comparison circuit 34 is connected to the NMOS transistor 31 side, and an inversion input end (−) of the comparison circuit 24 is connected to the grounding terminal 5 side. When a voltage drop in the resistance 32 exceeds a threshold value of the comparison circuit 34, the comparison circuit 34 outputs an H-level overcurrent detection signal OCPL.

The overcurrent detection signal OCPL is supplied to a gate circuit 90. When the H-level overcurrent detection signal OCPL is supplied, the gate circuit 90 supplies an L-level drive signal DL to a gate of the NMOS output transistor 12. In other words, control for turning OFF the NMOS output transistor 12 is executed. Caused by this control, when the overcurrent detecting circuit 33 detects the output current IOUT that exceeds a predetermined threshold value, the NMOS output transistor 12 is immediately turned. OFF without providing a mask time interval. Thus, it is possible to prevent a case where the NMOS output transistor 12 goes into a failure.

The overcurrent detection signal OCPL is supplied to in interval setting circuit 50. The interval setting circuit 50 includes an NMOS transistor 54 having a gate to which the overcurrent detection signal OCPL is supplied. A capacitor 52 is connected between a source and a drain of the NMOS transistor 54. The interval setting circuit 50 includes an AND circuit 53 and a constant-current source 51 that charges the capacitor 52.

One input end of the AND circuit 53 is connected to a connection point between the capacitor 52 and the constant-current source 51, and a PWM control signal CL transmitted from the control circuit 100 is supplied to the other input end of the AND circuit 53. An output signal of the AND circuit 53 is supplied to the gate circuit 90.

When voltages of both of the PWM control signal CL and the capacitor 52 are H-level, the AND circuit 53 outputs an H-level signal. An H-level output signal of the AND circuit 53 is output via the gate circuit 90. In other words, when an output signal of the AND circuit 53 is H-level, the drive signal DL output from the gate circuit 90 becomes H-level, and the NMOS output transistor 12 is turned ON.

On the other hand, when the overcurrent detecting circuit 33 detects overcurrent and the overcurrent detection signal OCPL becomes H-level, the NMOS transistor 54 is turned ON so as to discharge electric charge of the capacitor 52. Thus, a voltage of the capacitor 52 becomes L-level, and thus an output signal of the AND circuit 53 becomes L-level. When the L-level signal is supplied from the AND circuit 53, the gate circuit 90 supplies the L-level drive signal DL to a gate of the NMOS output transistor 12. Thus, the NMOS output transistor 12 is turned OFF.

The capacitor 52 is charged by the constant-current source 51, and thus the voltage on an electrode side that is connected to the AND circuit 53 linearly rises in proportion so the time. When the voltage of the capacitor 52 rises to reach an H-level, the AND circuit 53 outputs an H-level signal, and the H-level signal is supplied to the gate circuit 90. Thus, the H-level drive signal DL is supplied to the gate of the NMOS output transistor 12. Thus, the NMOS output transistor 12 is turned ON.

In other words, when the overcurrent detecting circuit 33 detects an overcurrent state and the H-level overcurrent detection signal OCPL is output, control is executed for turning ON the NMOS output transistor 12 at predetermined time intervals decided by using a current value of the constant-current source 51, a capacitance value of the capacitor 52, and a threshold value of the AND circuit 53.

When the H-level overcurrent detection signal OCPL is not output from the overcurrent detecting circuit 33, in other words, in a case of a non-overcurrent state, the voltage of the capacitor 52 is kept to be H-level. Thus, it goes into a state of control in which the NMOS output transistor 12 is turned. ON when the PWM control signal CL is H-level and the NMOS output transistor 12 is turned OFF when the PWM control signal CL is L-level, in other words, a steady control state in which the NMOS output transistor 12 is turned ON/OFF in accordance of a level of the PWM control signal CL.

The overcurrent detection signal OCPL is supplied to a count circuit 70. The count circuit 70 includes a counter 72 that counts the number of the H-level overcurrent detection signals OCPL. When a count value of the overcurrent detection signal OCPL reaches a predetermined number, for example, "4", the counter 72 outputs an H-level signal, and an AND circuit 71 outputs an H-level overcurrent detection flag FL. Thus, the H-level overcurrent detection flag FL indicates that a state continues where overcurrent is flowing into the NMOS output transistor 12.

The state where overcurrent is flowing into the MOS output transistor 12 occurs in a state where the output terminal 4 is in contact with the power-source supplying terminal 3, in other words, in a case of a power-supply fault. In this case, when the input voltage VIN is directly applied to between a source and a drain of the NMOS output transistor 12, it is turned into a state where overcurrent flows. In FIG. 1, a switch 6 is illustrated in order to indicate a state of a power-supply fault. A state where the switch 6 is turned ON corresponds to a power-supply fault.

A resistive voltage divider 110 is arranged between the output terminal 4 and the ground, which is constituted of a serial circuit of a resistance $R_{f1}$ and a resistance $R_{f2}$. The resistive voltage divider 110 supplies, to a non-inversion input end (+) of a comparison circuit 111, the feedback voltage VFB obtained by dividing the output voltage VOUT by using a resistance ratio between the resistance $R_{f1}$ and the resistance $R_{f2}$. A power source 113 that supplies the reference voltage VREF is connected to an inversion input end (−) of the comparison circuit 111. The comparison circuit 111 supplies an output signal to a PWM circuit 112 in accordance with a comparison result between the feedback voltage FB and the reference voltage VREF.

The PWM circuit 112 compares a saw-tooth wave (not illustrated) generated in response to a clock signal CLK with an output signal of the comparison circuit 111, generates a PWM signal whose duty ratio is adjusted in accordance with an output signal of the comparison circuit 111, and supplies the generated signal to the control circuit 100.

The control circuit 100 includes a control signal generating circuit 101. The control signal generating circuit 101 generates and outputs the PWM control signals CH and CL. The PWM control signal CH controls turning ON/OFF of the PMOS output transistor 11, and the PWM control signal CL controls turning ON/OFF of the NMOS output transistor 12. Note that the control signal generating circuit 101 generates the PWM control signals CH and CL while providing a predetermined dead-time interval in order to prevent the output transistors 11 and 12 from simultaneously turning into an ON state.

The control circuit 100 includes a timer 102. The timer 102 holds a value obtained by measuring a set time interval starting from a timing at which the overcurrent detection signal OCPH and the overcurrent detection signal OCPL are detected, for example. Moreover, the timer 102 holds a value obtained by totaling a time interval during which an output signal of the PWM 112 is in an H-level state or an L-level state from a timing at which the overcurrent detection signal OCPH and the overcurrent detection signal OCPL are detected, for example.

The control circuit 100 includes a determination circuit 103. The determination circuit 103 generates, on the basis of a value held by the timer 102, the reset signals Reset1 and Reset2, and supplies the generated signals to the counters 62 and 72. When the timer 102 reaches a predetermined value, the determination circuit 103 executes control for resetting the counters 62 and 72, for example. Furthermore, when receiving supply of the overcurrent detection flags FH and FL, the determination circuit 103 executes control for resetting the counters 62 and 72.

The overcurrent detection flag FH is supplied to the control circuit 100. When the overcurrent detection flag FH is H-level, the control signal generating circuit 101 sets the PWM control signal CH to an L-level. Caused by this control, the CMOS output transistor 11 is turned OFF, so that it is possible to prevent a state where overcurrent continues to flow.

The overcurrent detection flag FL is supplied to the control circuit 100. When the overcurrent detection flag FL is H-level, the control signal generating circuit 101 sets the PWM control signal CL to an L-level. Caused by this control, the NMOS output transistor 12 is turned OFF, so that it is possible to prevent a state where overcurrent continues to flow.

When a predetermined number of the H-level overcurrent detection signals OCPL are not counted within a predetermined time interval, the determination circuit 103 supplies the reset signal Reset2 to the counter 72. For example, the determination circuit 103 counts the number of the H-level overcurrent detection signals OCPL within the predetermined time interval, and supplies the reset signal Reset2 to the counter 72 when a count value does not reach the predetermined number.

According to the present embodiment, there is executed the control for immediately turning OFF the output transistors 11 and 12 when the overcurrent detecting circuits 23 and 33 detect overcurrent states of the output transistors 11 and 12. When the overcurrent detection signals OCPH and OCPL, which indicate an overcurrent state, are counted up to a predetermined number within a predetermined time interval, in other words, when an overcurrent state continues, there is executed the control for outputting the overcurrent detection flags FH and FL that report an abnormality, and for controlling the PWM control signals CH and CL to turn OFF the output transistors 11 and 12 for a predetermined time interval, for example.

On the other hand, when the overcurrent detection signals OCPH and OCPL are not counted up to the predetermined number within the predetermined time interval, the operation is returned to a steady control operation. For example, in such a case of occurrence of overcurrent due to noise, an overcurrent state is released within time intervals of the interval setting circuits 40 and 50. In such a case, the operation is able to be returned to a steady control after predetermined time intervals set in the interval setting circuits 40 and 50 have elapsed.

Although the output transistors 11 and 12 are forcibly turned OFF during the time interval even when an overcurrent state is released, when the time interval is appropriately set to a short time interval, it is possible to reduce effects on ON-duties of the output transistors 11 and 12 due to the PWM control signals CH and CL.

In the driver circuit 10, the above-mentioned protection circuits are respectively provided to the PMOS output transistor 11 on the high side and the NMOS output transistor 12 on the low side, so that it is possible to protect the output transistors 11 and 12 from a state where overcurrent flows due to a power-supply fault or a ground fault.

There is provided a configuration in which time intervals of the interval setting circuits 40 and 50 are set in consideration of the minimum pulse width of a PWM signal generated by the PWM circuit 112, in other words, the minimum ON-duty, and thus, in a case of an overcurrent state, at least one of the overcurrent detection signals OCPH and OCPL is detected with respect to one of the PWM control signals CH and CL. A relation between a predetermined set time interval ST that is held by the timer 102, a period T of a PWM control signal, and a set number of counts SC is adjusted such that the relation is, for example, "period T of PWM control signal"×"set number of counts SC"<"set time interval ST". In other words, the set time interval ST is set to a time interval that is longer than a value obtained by multiplying a period of a PWM control signal by the set number of counts SC. When the overcurrent detection signals OCPH and OCPL are counted by the counters 62 and 72 until the set time interval ST has elapsed so as to determine an overcurrent state, an overcurrent state is able to be reliably detected even when ON-duties of the PWM control signals CH and CL are small.

Figure 2:
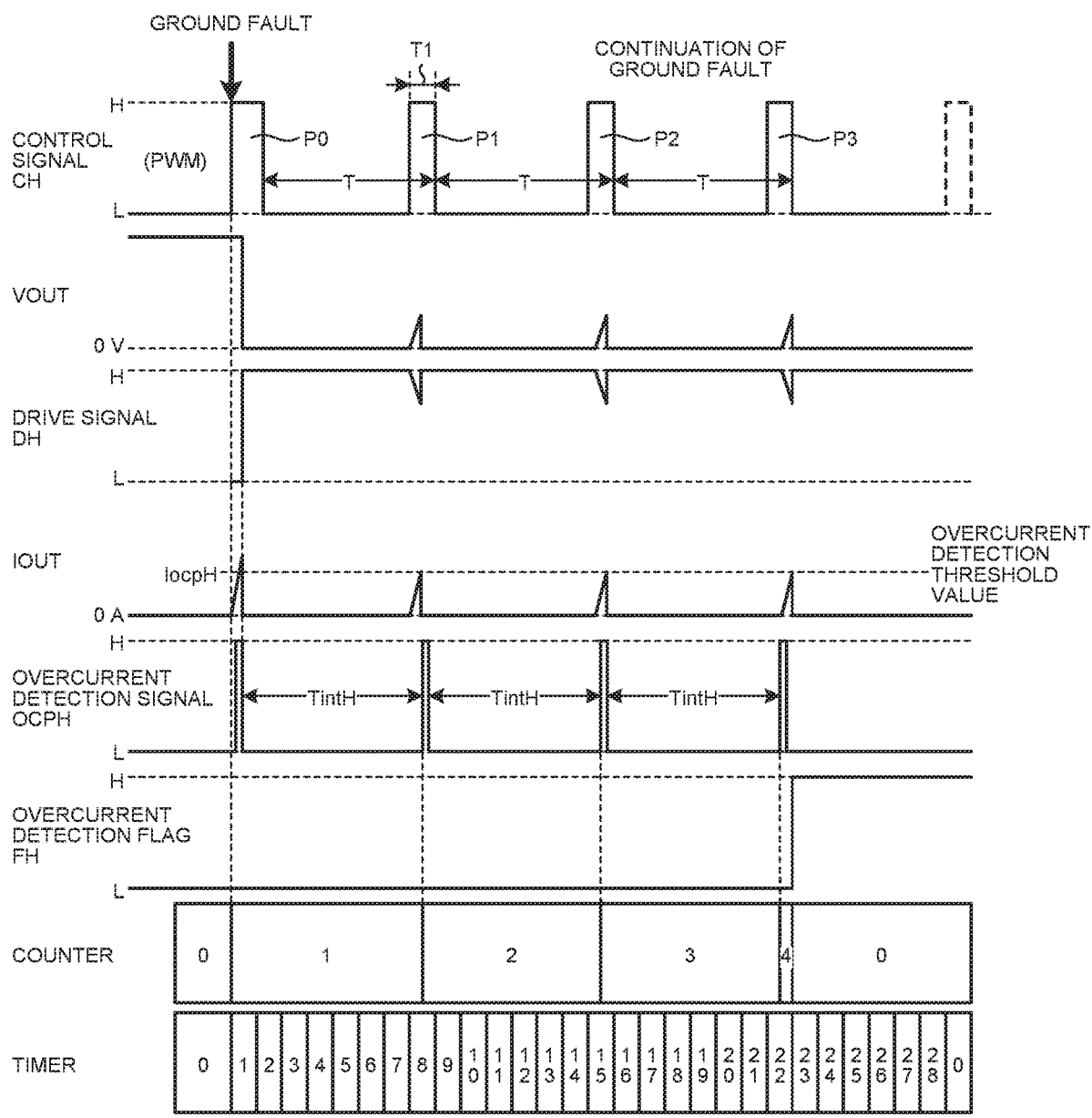
FIG. 2 is a diagram illustrating an operation of overcurrent protection against a ground fault.

FIG. 2 is a diagram illustrating an operation of overcurrent protection against a ground fault. There are illustrated in FIG. 2 signal waveforms of the PWM control signal CH, the output voltage VOUT, the drive signal DH, the output current IOUT, the overcurrent detection signal OCPH, and the overcurrent detection flag FH; a count value of the counter 62; and a measurement value of the timer 102. The PWM control signal CH is generated by the control signal generating circuit 101 in response to a PWM signal, and thus is generated with the period T corresponding to a period of the clock signal CLK. A time width of an H-level of each of signals P0 to P3 in the PWM control signal CH is changed in accordance with a duty ratio.

When the first signal P0 of the PWM control signal CH is turned into an H-level and a ground fault occurs, the output voltage VOUT is changed into a ground potential, and the output current IOUT flowing into the PMOS output transistor 11 becomes overcurrent.

The timer 102 starts to measure the set time interval ST from a timing at which the overcurrent detection signal OCPH indicating an overcurrent state due to a ground fault is detected. The set time interval ST is adjusted such that the following relation is satisfied: "period T of PWM control signal"×"set number of counts SC"<"set time interval ST". In the example illustrated in FIG. 2, the set time interval ST is "28". When the counted number reaches a set time interval "28", the timer 102 is reset.

The count circuit 60 counts the H-level overcurrent detection signal OCPH. When the H-level overcurrent detection signal OCPH within the set time interval reaches a predetermined number, the overcurrent detection flag FH is changed into an H-level. The PWM control signal CH is changed into L-level in response to the H-level overcurrent detection flag FH. In other words, the control is executed for turning OFF the PMOS output transistor 11. In response to the overcurrent detection flag FH, the determination circuit 103 supplies the reset signal Reset1 to the counter 62. Thus, the counter 62 is reset.

In a case of the example illustrated in FIG. 2, the overcurrent detection signal OCPH is detected four times within the set time interval "28" and the overcurrent detection flag FH is turned into an H-level, moreover, when a count value does not reach the predetermined number within the set time interval, an overcurrent state due to a ground fault is determined to be released, and the determination circuit 103 resets the counter 62 in response to a measurement value of the timer 102. The counter 62 is reset after she set time interval has elapsed, so that it is possible to reduce effects due to a noise and the like.

When overcurrent flowing into the PMOS output transistor 11 is detected, the control is executed for immediately turning OFF the PMOS output transistor 11 by using the overcurrent detection signal OCPH, and when a state where overcurrent is flowing continues due to a ground fault, by using the overcurrent detection flag FH indicating such a state, the PWM control signal CH itself is controlled to turn OFF the PMOS output transistor 11, so that it is possible to realize protection from overcurrent.

The H-level overcurrent detection signal OCPH is counted by the counter 62 until the set time interval ST has elapsed, so as to determine an overcurrent state. Thus, even when a duty ratio of the PWM control signal CH becomes small and a time width of the PWM control signal CH in an H-level becomes accordingly short, an overcurrent state is able to be reliably detected.

In a case of the example illustrated in FIG. 2, a time interval TintH of the overcurrent detection signal. OCPH is set in accordance with the period T of the PWM control signal CH. Not limited to the setting, for example, the plurality of time intervals TintH may be set to be included within a time interval during which the one PWM control signal CH is H-level.

Figure 3:
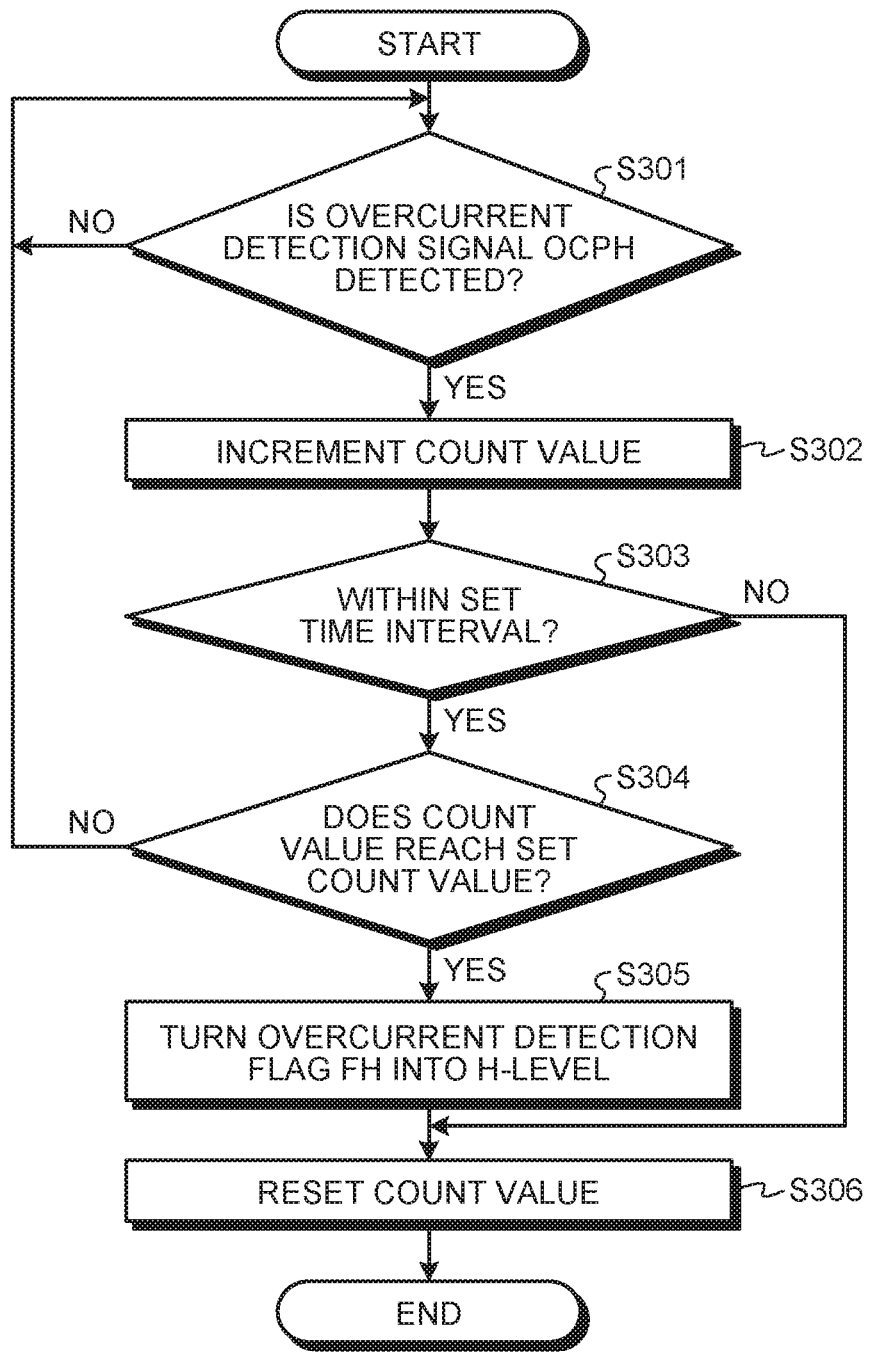
FIG. 3 is a flowchart illustrating one control method of the driver circuit having the overcurrent protection function.

FIG. 3 is a flowchart illustrating one example of a control method of the driver circuit having the overcurrent protection function. The flowchart corresponds to a flow of a protection operation in an overcurrent state due to a ground fault. When detecting the overcurrent detection signal OCPH (Step S301: Yes), the count circuit 60 increments a count value (Step S302). When not detecting the overcurrent detection signal OCPH (Step S301: No), the detecting operation is continued. Note that measurement of a time interval by the timer 102 is started in response to detection of the overcurrent detection signal OCPH.

The control circuit 100 starts its counting, and then determines whether or not a set time interval has elapsed (Step S303). Within the set time interval (Step S303: Yes), whether or not a count value reaches a predetermined number, for example, "4" is determined (Step S304). When the count value reaches the predetermined number (Step S304: Yes), the overcurrent detection flag, FH is turned into an H-level (Step S305). In other words, a ground-fault state is determined to continue. The control circuit 100 resets the count value in response to the H-level overcurrent detection flag FH (Step S306). When a count value does not reach the predetermined number (Step S304: No), the detecting operation is continued.

When the set time interval has elapsed (Step S303: No), the count value is reset (Step S306). Thus, the operation is returned to a steady operation using the PWM control signal CH.

The control is executed for determining whether or not the number of the overcurrent detection signals OCPH reaches the set number of counts SC within the set time interval SI that is set to satisfy the relation of "period T of PWM control signal CH"×"set number of counts SC"<"set time interval ST". Thus, it is possible to reliably detect continuation of a ground-fault state even when an ON-duty of the PWM control signal CH is small, so that it is further possible to execute a protection operation from an overcurrent state.

Figure 4:
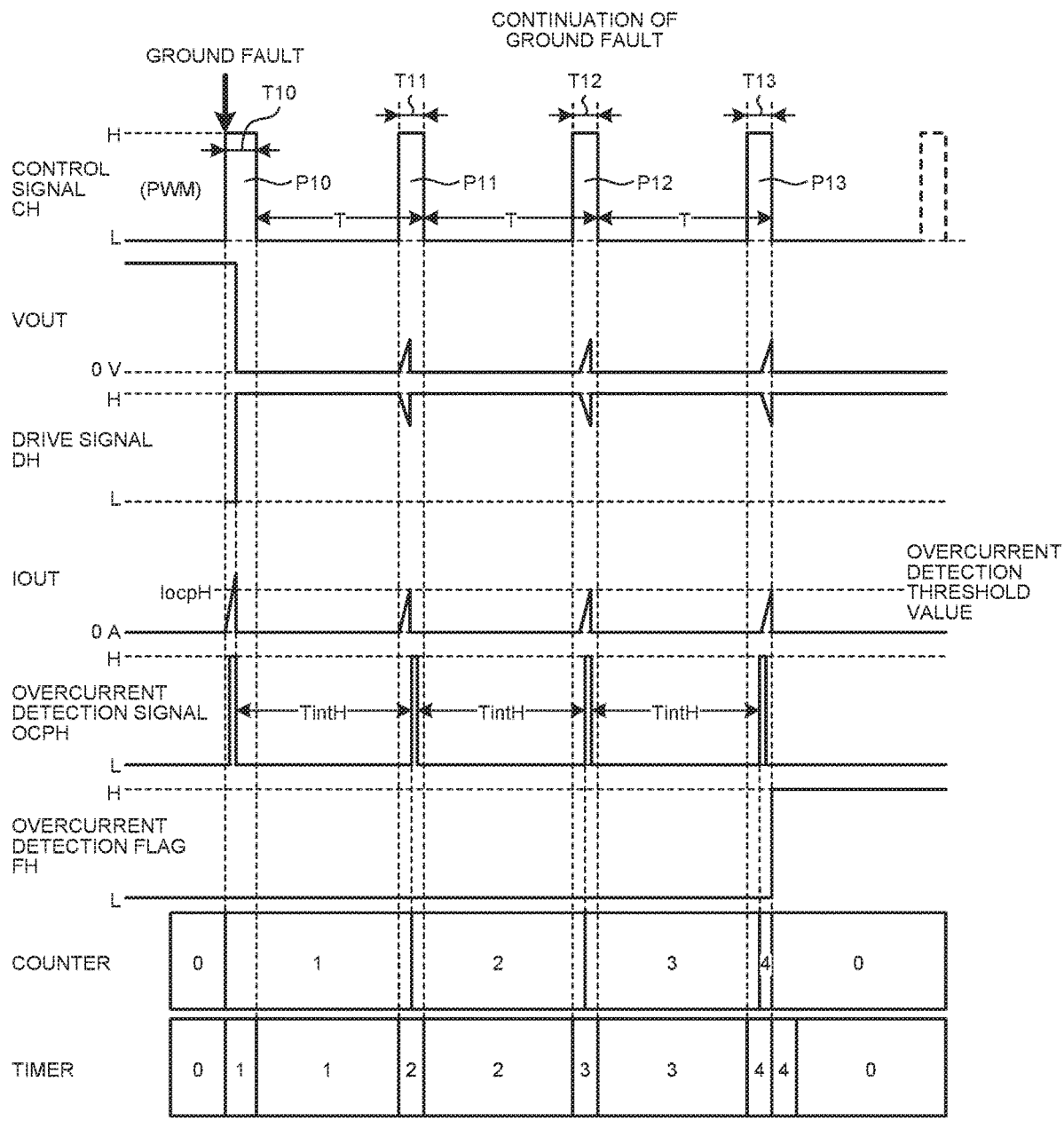
FIG. 4 is a diagram illustrating another operation of overcurrent protection against a ground fault.

FIG. 4 is a diagram illustrating another operation of overcurrent protection against a ground fault. There are illustrated in FIG. 4 signal waveforms of the PWM control signal CH, the output voltage VOUT, the drive signal OH, the output current LOUT, the overcurrent detection signal OCPH, and the overcurrent detection flag FH; a count value of the counter 62; and a total value of the timer 102. There is illustrated a situation in which the PWM control signal CH is output with the period T. Basically, the operation is the same as that illustrated in FIG. 2; however, a total value of the timer 102 is different from that illustrated in FIG. 2.

The timer 102 totals time intervals during which the PWM control signal CH is H-level. In other words, a value obtained by totaling time intervals T10 to T13 during each of which the PWM control signal CH is H-level is stored. The time intervals alone are totaled during each of which the PWM control signal CH is H-level and that are after a signal P10 at a detection timing of the H-level overcurrent detection signal OCPH due to a ground fault until a signal P13. In other words, time intervals during each of which the PWM control signal CH is L-level is not totaled.

In a case where the H-level overcurrent detection signal OCPH has reached a predetermined count value when the total value reaches the set time interval ST, an overcurrent state due to a ground fault is determined to continue, and thus the overcurrent detection flag FH is turned into an H-level. In other words, even when an ON-duty of the PWM control signal CH is changed, an overcurrent state is determined by counting the number of the H-level overcurrent detection signals OCPH within the set time interval ST. Thus, overcurrent is able to be reliably detected even when an ON-duty of the PWM control signal CH is short.

In the example illustrated in FIG. 4, the overcurrent detection signal OCPH is detected four times during a set time interval "4", and the overcurrent detection flag FH is turned into an H-level. When the overcurrent detection flag FH becomes H-level, the determination circuit 103 resets a count value. When the count value does not reach the predetermined number during the set time interval ST, an overcurrent state due to a ground fault is determined to be released, and the determination circuit 103 resets the count value in response to a total value of the timer 102.

Time intervals alone during each of which the PWM control signal CH is H-level are totaled, and an overcurrent state due to a ground fault is detected by whether or not the predetermined number of the H-level overcurrent detection signals OCPH are counted by a time point at which the totaled time interval reaches the set time interval ST. In other words, detection of an overcurrent state is executed within a set time interval by a total value under a state where the PWM control signal CH turns ON the PMOS output transistor 11. Thus, an overcurrent state is able to be reliably detected even when an ON-duty of the PWM control signal CH is small.

Figure 5:
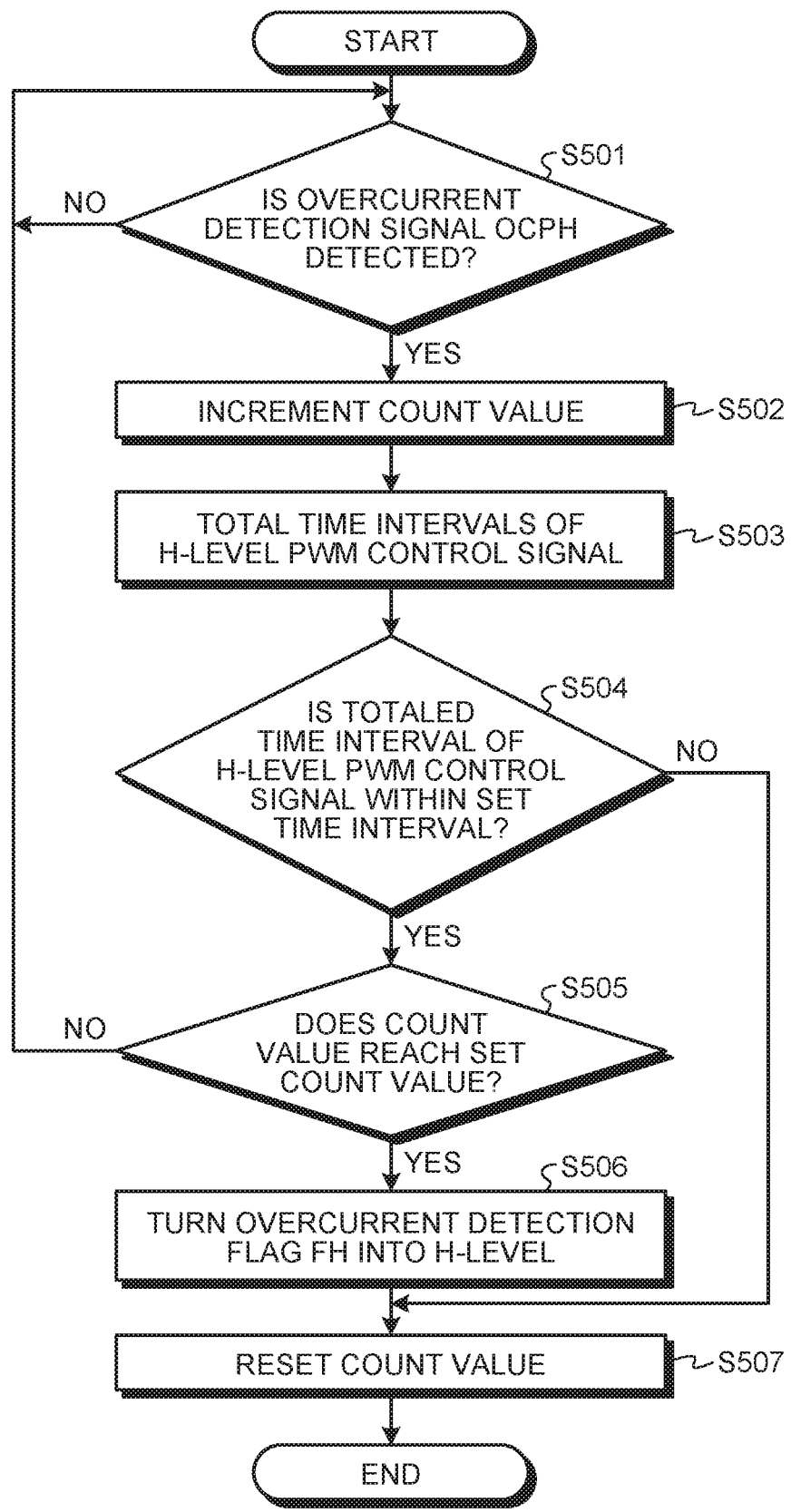
FIG. 5 is a flowchart illustrating another control method of the driver circuit having the overcurrent protection function.

FIG. 5 is a flowchart illustrating another control method of the driver circuit having the overcurrent protection function. The flow corresponds to the flow of the protection operation in an overcurrent state due to a ground fault, which is Illustrated in FIG. 4. When detecting the overcurrent detection signal OCPH (Step S501: Yes), the count circuit 60 increments a count value (Step S502), and totals time intervals of the H-level PWM control signal CH (Step S503). When not detecting the overcurrent detection signal OCPH (Step S501: No), a detecting operation is continued. The timer 102 starts to total time intervals of the H-level PWM control signal CH in response to detection of the overcurrent detection signal OCPH.

When a totaled time interval of the H-level PWM control signals CH is within the set time interval ST (Step S504: Yes), whether or not a count value reaches a predetermined number is determined (Step S505).

When the count value has reached the predetermined number (Step S505: Yes), the overcurrent detection flag FH is turned into an H-level (Step S506). In other words, a ground-fault state is determined to continue. In response to the H-level overcurrent detection flag FH, the control circuit 100 resets the count value (Step S507). When the count value has not reached the predetermined number (Step S505: No), the detecting operation is continued.

When a totaled time interval of the H-level PWM control signals CH exceeds a previously-set time interval (Step S504: No), the count value is reset (Step S507). Caused by the reset of the count value, the operation is returned to a steady operation using the PWM control signal CH.

In a case where a count value of the overcurrent detection signals OCPH reaches a predetermined number when the totaled time interval of the H-level PWM control signals CH has reached the set time interval ST, an overcurrent state due to a ground fault is determined to continue, and the overcurrent detection flag FH is turned into an H-level. In other words, even when an ON-duty of the PWM control signal CH is changed, the overcurrent detection signal OCPH within the set time interval ST is counted to be able to determine an overcurrent state. Thus, even when a time interval of the H-level PWM control signal CH is short, the overcurrent detection signal OCPH is able to be reliably detected and is further able to detect an overcurrent state.

When an overcurrent state is within a short time interval due to a noise and the like, the operation is able to be shifted to a steady control state after the time interval TintH. In other words, by employing the predetermined time interval TintH, it is possible to return the operation to a steady control state within a short time interval.

Figure 6:
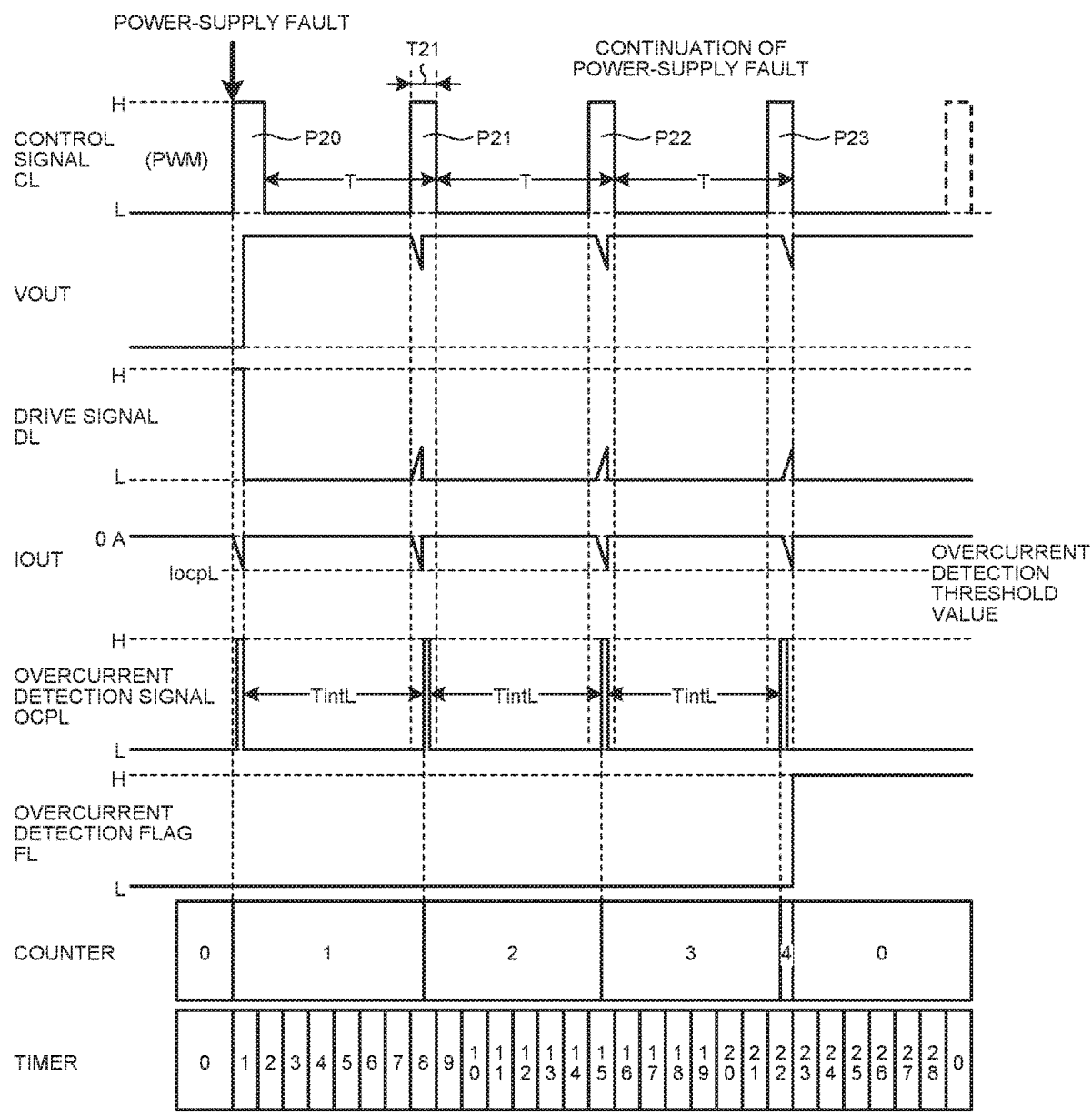
FIG. 6 is a diagram illustrating an operation of overcurrent protection against a power-supply fault.

FIG. 6 is a diagram illustrating an operation of overcurrent protection against a power-supply fault. There is illustrated a protection operation against overcurrent that is generated when a power-supply fault occurs in a state where the NMOS output transistor 12 is in an ON state. There are illustrated in FIG. 6 signal waveforms or the PWM control signal CL, the output voltage VOUT, the drive signal DL, the output current IOUT, the overcurrent detection signal OCPL, and the overcurrent detection flag FL; a count value of the counter 72; and a measurement value of the timer 102. The PWM control signal CL is generated by the control signal generating circuit 101 in response to a PWM signal, and thus is generated with the period. T that corresponds to a period of the clock signal CLK. Each of signals P20 to P23 of the PWM control signal CL includes a time interval of an H-level corresponding, to an ON-duty.

When the signal P20 of the PWM control signal CL is turned into an H-level and a power-supply fault has occurred, the output voltage VOUT is changed into the input voltage VIN, and the output current LOUT flowing into the NMOS output transistor 12 becomes overcurrent. Note that a direction of the output current LOUT flowing from the output terminal 4 is defined as a positive direction, and thus the output current LOUT illustrated in FIG. 6 is indicated as a negative current.

When overcurrent flowing into the NMOS output transistor 12 is detected, the control is executed for immediately turning OFF the NMOS output transistor 12 by using an output signal from the overcurrent detecting circuit 33, and when a state where overcurrent is flowing continues due to a power-supply fault, by using the overcurrent detection flag FL indicating such a state, the PWM control signal CL itself is controlled to turn OFF the NMOS output transistor 12, so that it is possible to realize protection from overcurrent.

When a power-supply fault is released within a time interval TintL, the overcurrent detection signal OCPL is not output, and thus the operation is returned to a steady control in which turning ON/OFF of the HMO' output transistor 12 is controlled in response to the PWM control signal CL.

In a case of a state where overcurrent is flowing into the NMOS output transistor 12, caused by the control in which the NMOS output transistor 12 is immediately turned OFF by the overcurrent detection signal OCPL, the HMOS output transistor 12 is protected from an overcurrent state.

Whether or not the overcurrent state continues is able to be determined by the number at the H-level overcurrent detection signals OCPL counted by the count circuit 70 within a predetermined time interval. When an overcurrent state continues, the overcurrent detection flag FL is output, the PWM control signal CL is controlled in response to the overcurrent detection flag FL, so that it is possible to execute the control for turning OFF the NMOS output transistor 12.

Moreover, for example, when an overcurrent state is released within the time interval TintL, or when a count value of the overcurrent detection signal OCPL within a predetermined time interval does not reach a predetermined number, in short, when the overcurrent state is within a short time interval, the operation is returned to a steady control after the time interval TintL or a previously-set time interval. Thus, it is possible to reduce effects on the control for setting, by using the PWM control signals CH and CL, ON-duties of the PMOS output transistor 11 and the NMOS, output transistor 12.

The timer 102 starts to measure the set time interval ST from a timing at which the overcurrent detection signal OCPL indicating an overcurrent state due to a power-supply fault is detected. The set time interval ST is adjusted so as to satisfy a relation of "period T of PWM control signal"× "set number of counts SC"<"set time interval ST". In the example illustrated in FIG. 6, the set time interval ST is set to 28. When the set time interval reaches "28", the timer 102 is reset.

The count circuit 70 counts the H-level overcurrent detection signal OCPL. When the H-level overcurrent detection signal OCPL within the set time interval reaches a predetermined number, the overcurrent detection flag FL is turned into an H-level. In a case of the example illustrated in FIG. 6, the overcurrent detection signal OCPL is counted four times within the set time interval, and the H-level overcurrent detection flag FL is output. The determination circuit 103 supplies the reset signal Reset2 to the counter 72 in response to the overcurrent detection flag FL. Thus, the counter 72 is reset.

In a case of the example illustrated in FIG. 6, the overcurrent detection signal OCPL is detected four times within a set time interval "28", and the overcurrent detection flag FL is turned into an H-level. When a count value does not reach a predetermined number within the set time interval, an overcurrent state due to a power-supply fault is determined to be released, and the determination circuit 103 resets the counter 72 in response to a measurement value of the timer 102.

When overcurrent flowing into the NMOS output transistor 12 is detected, the control is executed for immediately turning OFF the NMOS output transistor 12 by using the overcurrent detection signal OCPL, and when a state where overcurrent is flowing continues due to a power-supply fault, by using the overcurrent detection flag FL indicating such a state, the PWM control signal Cu itself is controlled to turn OFF the NMOS output transistor 12, so that it is possible to realize protection from overcurrent.

The H-level overcurrent detection signal OCPL is counted by the counter 72 until the set time interval ST has elapsed, so as to determine an overcurrent state. Thus, even when a duty ratio of the PWM control signal CL becomes small, an overcurrent state is able to be reliably detected.

Figure 7:
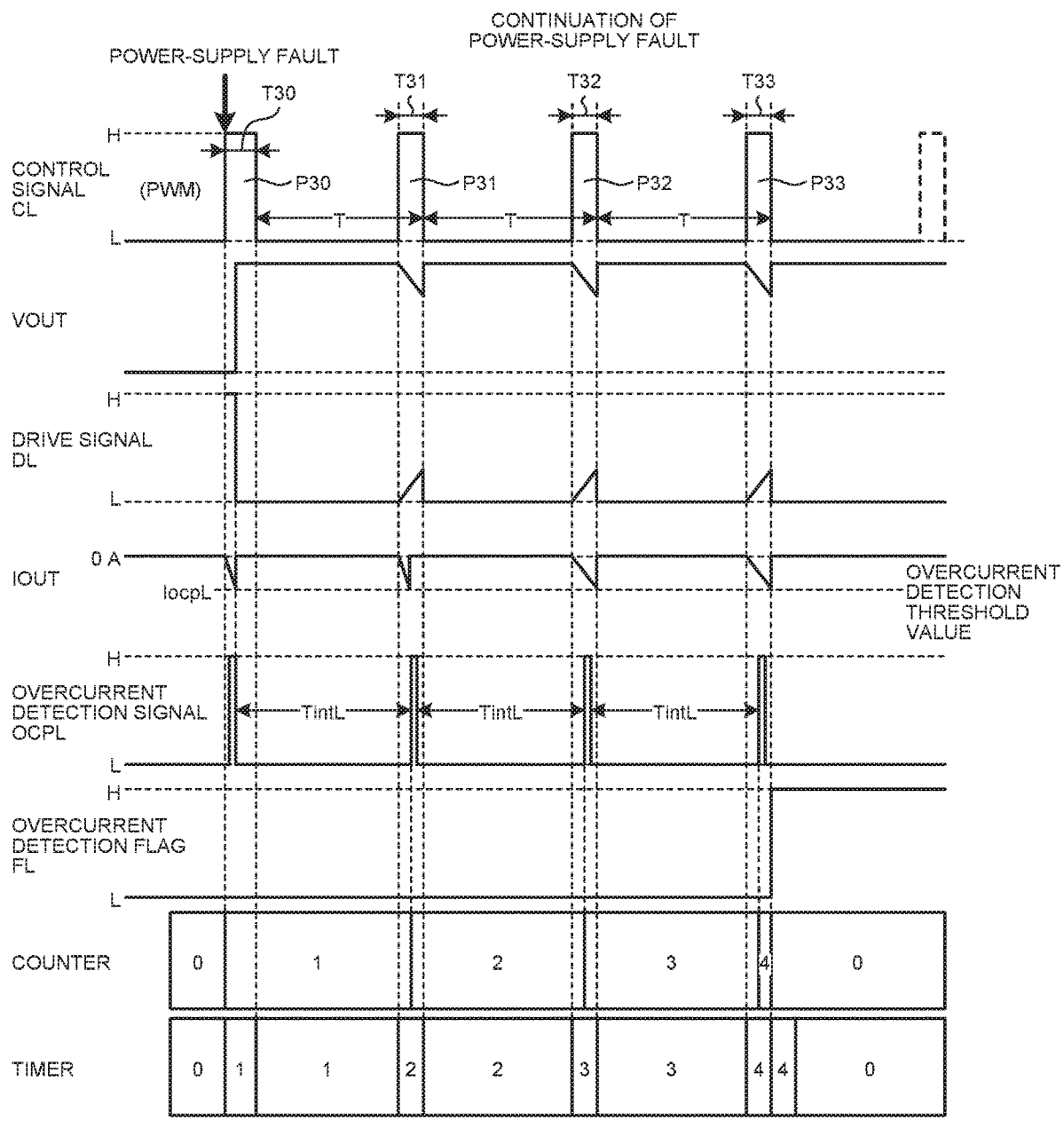
FIG. 7 is a diagram illustrating another operation of the overcurrent protection against the power-supply fault.

FIG. 7 is a diagram illustrating another operation of the overcurrent protection against the power-supply fault. There are illustrated in FIG. 7 signal waveforms of the PWM control signal CL, the output voltage IOUT, the drive signal DL, the output current IOUT, the overcurrent detection signal OCPL, and the overcurrent detection flag FL; a count value of the counter 72; and a total value of the timer 102. There is illustrated a situation in which the PWM control signal CL is output with the period T. Basically, the operation is the same as that illustrated in FIG. 6; however, a total value of the timer 102 is different from that illustrated in FIG. 6.

The timer 102 totals time intervals during which the PWM control signal CL is H-level. In other words, a value obtained by totaling time intervals 130 to 133 of respective H-level signals P30 to P33 is stored. The time intervals alone are totaled during each of which the PWM control signal CL is H-level and that are after the signal P30 at a detection timing of the H-level overcurrent detection signal OCPL due to a power-supply fault until the signal P33.

In a case where the H-level overcurrent detection signal OCPL has reached a predetermined count value when the total value reaches the set time interval ST, an overcurrent state due to a power-supply fault is determined to continue, and thus the overcurrent detection flag FL turned into an H-level. In other words, even when an ON-duty of the PWM control signal CL is changed, an overcurrent state is determined by counting the number of the H-level overcurrent detection signals OCPL within the set time interval ST. Thus, the overcurrent detection signal OCPL is able to be reliably detected even when an ON-duty of the PWM control signal CL is short.

In the example illustrated in FIG. 7, the overcurrent detection signal OCPL is detected four times during a set time interval "4", and the overcurrent detection flag FL is turned into an H-level. When the overcurrent detection flag FL becomes H-level, the determination circuit 103 resets a count value. When the count value does, not reach the predetermined number during the set time interval. ST, an overcurrent state due to a power-supply fault is determined to be released, and the determination circuit 103 resets the count value in response to a total value of the timer 102.

Time intervals alone during each of which the PWM control signal CL is H-level are totaled, and an overcurrent state due to a power-supply fault is detected by whether or not the predetermined number of the H-level overcurrent detection signals OCPL are counted by a time point at which the totaled time interval reaches the set time interval ST. In other words, detection of an overcurrent state is executed within a set time interval by a totaled time interval under a state where the PWM control signal CL turns ON the NMOS output transistor 12. Thus, an overcurrent state is able to be reliably detected even when an ON-duty of the PWM control signal CL is small.

The time intervals TintH and TintL may be appropriately set in accordance with capacities of the PMOS output transistor 11 and the NMOS output transistor 12, for example. For example, each of the time intervals may be set to 5μ to 10μ seconds.

Note that a configuration may be employed in which resistances (not illustrated) are connected to respective sources of the output transistors 11 and 12, and voltage drops are detected generated in the resistances so as to detect current flowing into each of the output transistors 11 and 12 and further to detect an overcurrent state.

Note that there presents no need for providing the above-mentioned protection circuits to the PMOS output transistor 11 on the high side and the NMOS output transistor 12 on the low side, and a configuration may be employed in which the above-mentioned protection circuit is provided to one of the output transistors.

Furthermore, a configuration may be employed in which the PMOS output transistor 11 on the high side alone may be caused to execute a switching operation, and a driver circuit including a diode is provided on the low side and the above-mentioned protection circuit is provided on the high side.

Furthermore, a configuration may be employed in which, when the H-level overcurrent detection flags FH and FL are supplied, signals for turning OFF the PMOS output transistor 11 and the NMOS output transistor 12 may be separately supplied without changing signal levels of the PWM control signals CH and CL, instead of the control for changing signal levels of the PWM control signals CH and CL.

While certain embodiments have been described, these embodiments have been presented by way of example only, and are not intended to limit the scope of the inventions. Indeed, the novel embodiments described herein may be embodied in a variety of other form; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A driver circuit having an overcurrent protection function, the circuit comprising:
    an output transistor that supplies an output current to a load;
    a control signal generating circuit that outputs a Pulse Width Modulation (PWM) control signal, the PWM control signal controlling turning ON and OFF of the output transistor;
    a current detecting circuit that detects a current flowing through the output transistor;
    an overcurrent detecting circuit that outputs an overcurrent detecting signal when a value of the current detected by the current detecting circuit exceeds a predetermined threshold value;
    a counter that counts a number of times that the overcurrent detecting signal is output;
    a control circuit that generates, when a count value of the counter exceeds a predetermined number within a preset time interval, a signal indicating an overcurrent state; and
    an interval setting circuit that outputs, in response to the PWM control signal and the overcurrent detecting signal, an output signal that turns ON the output transistor after a predetermined time interval from a timing at which the overcurrent detecting signal is output in a control state where the PWM control signal turns ON the output transistor.

2. The driver circuit having the overcurrent protection function according to claim 1, wherein the preset time interval is a time interval that is longer than a value obtained by multiplying a period of the PWM control signal by the predetermined number.

3. The driver circuit having the overcurrent protection function according to claim 1, wherein the preset time interval is a total time interval of a state where the PWM control signal turns ON the output transistor, and starts from a timing at which the overcurrent detecting signal is detected.

4. The driver circuit having the overcurrent protection function according to claim 1, wherein when the count value does not exceed the predetermined number within the preset time interval, the control circuit supplies, to the counter, a signal that resets the count value.

5. The driver circuit having the overcurrent protection function according to claim 1, wherein the interval setting circuit outputs the output signal after a time interval corresponding to a period of the PWM control signal.

6. The driver circuit having the overcurrent protection function according to claim 1, wherein when the count value reaches the predetermined number, the control circuit supplies, to the counter, a signal that resets the count value.

7. The driver circuit having the overcurrent protection function according to claim 1, wherein in response to the signal indicating the overcurrent state, the control signal generating circuit outputs the PWM control signal that turns OFF the output transistor.

8. The driver circuit having the overcurrent protection function according to claim 1, wherein the current detecting circuit includes a second transistor that is connected in parallel to the output transistor to constitute a current mirror circuit along with the output transistor.

9. The driver circuit having the overcurrent protection function according to claim 1, wherein the interval setting circuit includes:
    a capacitor that is charged by a constant current; and
    a switch that discharges, in response to the overcurrent detecting signal, electric charge charged in the capacitor.

10. The driver circuit having the overcurrent protection function according to claim 1, further comprising:
    a PWM generating circuit configured to:
        generate a PWM signal in accordance with a result of comparison between a reference voltage and a feedback voltage of an output voltage supplied to the load; and
        supply the generated PWM signal to the control signal generating circuit.

11. A control method of a driver circuit having an overcurrent protection function, the method comprising:
    outputting a PWM control signal that controls turning ON and OFF of an output transistor that supplies an output current to a load;
    detecting a current flowing through the output transistor;
    when a value of the detected current exceeds a predetermined threshold value, outputting an overcurrent detecting signal;
    obtaining a count value by counting a number of times that the overcurrent detecting signal is output;
    when the count value exceeds a predetermined value within a preset time interval, generating a signal indicating an overcurrent state; and
    in a control state where the PWM control signal turns ON the output transistor, turning ON the output transistor after a predetermined time interval from a timing at which the overcurrent detecting signal is output.

12. The control method of the driver circuit having the overcurrent protection function according to claim 11, wherein the preset time interval is a total time interval of a state where the PWM control signal turns ON the output transistor, and starts from a timing at which the overcurrent detecting signal is detected.

13. The control method of the driver circuit having the overcurrent protection function according to claim 11, wherein the preset time interval is a time interval that is longer than a value obtained by multiplying a period of the PWM control signal by the predetermined number.

14. The control method of the driver circuit having the overcurrent protection function according to claim 11, further comprising:
    turning ON the output transistor after a time interval corresponding to a period of the PWM control signal from the timing at which the overcurrent detecting signal is output.

15. The control method of the driver circuit having the overcurrent protection function according to claim 11, further comprising:
    when the count value does not exceed the predetermined value within the preset time interval, resetting the count value.

16. The control method of the driver circuit having the overcurrent protection function according to claim 11, further comprising:

when the count value reaches the predetermined value, resetting the count value.

17. The control method of the driver circuit having the overcurrent protection function according to claim 11, further comprising:

in response to the overcurrent detection signal, turning OFF the output transistor.

* * * * *